United States Patent [19]
Gea et al.

[11] Patent Number: 5,885,665
[45] Date of Patent: Mar. 23, 1999

[54] VO$_2$ PRECIPITATES FOR SELF-PROTECTED OPTICAL SURFACES

[75] Inventors: Laurence A. Gea, Knoxville; Lynn A. Boatner, Oak Ridge, both of Tenn.

[73] Assignee: The United States of America as represented by the United States Department of Energy, Washington, D.C.

[21] Appl. No.: 853,947

[22] Filed: May 9, 1997

[51] Int. Cl.$^6$ .......................... C23C 14/08; C23C 14/14; B05D 5/06; B05D 3/02

[52] U.S. Cl. ...................... 427/529; 427/531; 427/162; 427/376.2; 117/108

[58] Field of Search ................................ 427/529, 531, 427/527, 162, 376.2, 376.3; 204/192.16, 192.26; 117/108

[56] References Cited

U.S. PATENT DOCUMENTS

| | | | |
|---|---|---|---|
| 4,333,808 | 6/1982 | Bhattacharyya et al. | 427/529 |
| 4,351,712 | 9/1982 | Cuomo et al. | 427/529 |
| 4,507,189 | 3/1985 | Doi et al. | 427/529 |
| 4,634,600 | 1/1987 | Shimizu et al. | 427/531 |
| 4,678,678 | 7/1987 | Kamigaito et al. | 427/529 |
| 4,957,771 | 9/1990 | Enloe | 427/529 |
| 5,066,514 | 11/1991 | Oyoshi | 427/531 |
| 5,387,481 | 2/1995 | Radford et al. | 427/126.3 |
| 5,683,757 | 11/1997 | Iskanderova et al. | 427/529 |

OTHER PUBLICATIONS

M.F. Becker et al., "Femtosecond Switching of the Solid–State Phase Transition in the Smart System Material VO$_2$", SPIE 2189, 400(1994), no month.

M. Fukuma, S. Zembutsu, and S. Miyazawa, "Preparation of VO$_2$ Thin Film and its Direct Optical Bit Recording Characteristics", Appl. Opt. 22, 265 (1983). Jan.

A.A. Bugaev et al., "Selectivity of the Photoexcited Metal–Semiconductor Phase Transition in Vanadium Dioxide Initiated by Picosecond Pulses", JETP Lett. 34, 430 (1981). Oct.

R.M. Walser and M.F. Becker, "Fast Laser Kinetic Studies of the Semiconductor–Metal Phase Transition in VO$_2$ Thin Films", AIP Conf. Proc. 79, 117 (1979). no month.

J.S. Chivian, W.E. Case, and D.H. Rester, "A 10.6 $\mu$m Scan Laser with Programmable VO$_2$ Mirror", IEEE J. Quantum Electron, QE–15, 1326 (1979). Dec.

M.F. Becker, R.M. Walser, and R.W. Gunn, "Fast Laser Excitations in VO$_2$ at the Semiconducting–Metallic Phase Transition", *Picosecond Phenomena*, edited by Shank, Ippen, and Shapiro (Springer–Verlag, New York, 1978) pp. 236–239. no month.

A.W. Smith, "Optical Storage in VO$_2$ Films", Appl. Phys. Lett. 23, 437 (1973) no month.

W.R. Roach and I. Balberg, "Optical Induction and Detection of Fast phase Transition in VO$_2$", Solid State Commun. 9, 551 (1971). no month.

H.W. Verleur, A.S. Barker Jr., and C.N. Berglund, "Optical Properties of VO$_2$ Between 0.25 and 5eV", Phys. Rev. 172, 788 (1968). Aug.

F.J. Morin, "Oxides Which Show and Metal–to–Insulator Transition at the Neel Temperature", Phys. Rev. Lett 3, 34 (1959). Jul.

L.A. Gea and L.A. Boatner, "Optical Switching of Coherent VO$_2$ Preciptates Formed in Sapphire by Ion Implantation and Annealing", Appl. Phys. Lett. 68 (22), 27 May 1996.

*Primary Examiner*—Marianne Padgett
*Attorney, Agent, or Firm*—Virginia B. Caress; William R. Moser; Paul A. Gottlieb

[57] ABSTRACT

A method for forming crystallographically coherent precipitates of vanadium dioxide in the near-surface region of sapphire and the resulting product is disclosed. Ions of vanadium and oxygen are stoichiometrically implanted into a sapphire substrate (Al$_2$O$_3$), and subsequently annealed to form vanadium dioxide precipitates in the substrate. The embedded VO$_2$ precipitates, which are three-dimensionally oriented with respect to the crystal axes of the Al$_2$O$_3$ host lattice, undergo a first-order monoclinic-to-tetragonal (and also semiconducting-to-metallic) phase transition at ~77° C. This transformation is accompanied by a significant variation in the optical transmission of the implanted region and results in the formation of an optically active, thermally "switchable" surface region on Al$_2$O$_3$.

22 Claims, 5 Drawing Sheets

VO₂ PRECIPITATES FOR SELF-PROTECTED OPTICAL SURFACES

GOVERNMENT SUPPORT

This invention was made with government support under contract number DE-AC05-96OR22464 awarded by the Department of Energy. The government may have certain rights in this invention.

FIELD OF THE INVENTION

The present invention relates to a method for forming an active optical surface on a substrate, and the product formed thereby. More particularly, this invention relates to a method for forming coherent precipitates of vanadium dioxide in the near-surface region of a substrate by ion implantation and thermal treatment and the product formed thereby.

BACKGROUND OF THE INVENTION

Substances in which both sensing and actuating capabilities are coupled by an intrinsic control mechanism are sometimes referred to as "smart" materials. For instance, a thin film of vanadium dioxide ($VO_2$) deposited on a substrate is a classic example of a "smart" surface. $VO_2$ undergoes a phase transition at a relatively low temperature. This phase transition is accompanied by extraordinary changes in the electronic and optical properties of $VO_2$. In particulate or bulk form, $VO_2$ undergoes a first-order monoclinic-to-tetragonal, and semiconducting-to-metallic phase transition, at temperatures of approximately 73° C. to 68° C. When a $VO_2$ film is coated onto a transparent substrate, and illuminated so that the film absorbs sufficiently intense laser light, the resulting temperature increase can induce a rapid semi-conducting-to-metal phase transformation. The presence of the metallic $VO_2$ phase then produces a reflecting surface, that subsequently strongly attenuates further transmission of the incident laser radiation through the coated substrate. Accordingly, the $VO_2$ film performs both sensing and actuating functions through coupled intrinsic properties of the material.

Due to the reversible character of these changes, $VO_2$ thin films have been investigated as active layers for a variety of applications. These applications include: self-protecting support windows, erasable optical data recording, thermal sensors, and coatings for energy-efficient windows.

In conventional thin-film systems, a continuous $VO_2$ film is deposited on a surface of a substrate. As a result, thin layers of the $VO_2$ on the surface of the substrate are exposed to environmental degradation and contamination. In addition, because of the two dimensional orientation of the film, cross talk or strain problems occur between a "switched" and "unswitched" region. Another difficulty occurs from the poor adhesion between the film and the substrate, which results in the degradation of optical properties at the interface of the film and the substrate.

Therefore, there is a need in the art for a multi-layer composite system consisting of an optically active phase such as $VO_2$ and a durable host medium, which protects the three-dimensional orientation of optically active precipitates relative to the host medium, enhancing) the optical properties which can be obtained, including a well-defined variation in the optical reflectivity between "switched" and "unswitched" states.

SUMMARY OF THE INVENTION

A principal object of the present invention is to provide a multi-layer optical system which protects the chemical integrity, physical stability, and the three-dimensional orientation of embedded optically active precipitates relative to the host medium.

A further object of the present invention is to provide an optical system which includes a well-defined variation in the optical reflectivity or transmission between the switched and unswitched states of the precipitates.

An additional object of the present invention is to provide an optical system which protects the optical layer consisting of, for example, $VO_2$ particles embedded in a host medium from environmental degradation and contamination. The above objects are achieved according to the present invention.

A method of forming coherent precipitates of vanadium dioxide in the near-surface region of a substrate is disclosed. Ions of vanadium are implanted into a host material or substrate. Ions of oxygen are co-implanted into the substrate, with an oxygen to vanadium ratio of 2:1. The substrate is annealed to form vanadium dioxide precipitates in the near-surface region of the substrate. The resulting product is also disclosed.

A method of forming coherent precipitates of vanadium dioxide in the near-surface region of a substrate to lower the phase transition temperature of the precipitate-substrate is disclosed. Ions of vanadium are implanted into a host material or substrate. Ions of oxygen are co-implanted into the substrate, with an oxygen to vanadium ratio of 2:1. An impurity is implanted into the substrate to combine with the precipitated $VO_2$ phase and thereby lower the transition temperature. The substrate is annealed in a controlled atmosphere using inert gas to form vanadium dioxide precipitates containing the impurity in the near-surface region of the substrate. The resulting product is also disclosed.

These and other objects and advantages of the invention will be readily apparent in view of the following description and drawings of the above-identified invention.

BRIEF DESCRIPTION OF THE DRAWINGS

The above and other objects and advantages and novel features will become apparent from the detailed description of the preferred embodiment of the invention illustrated in the accompanying drawings, wherein.

DETAILED DESCRIPTION OF THE PREFERRED EMBODIMENT

Figure 1:
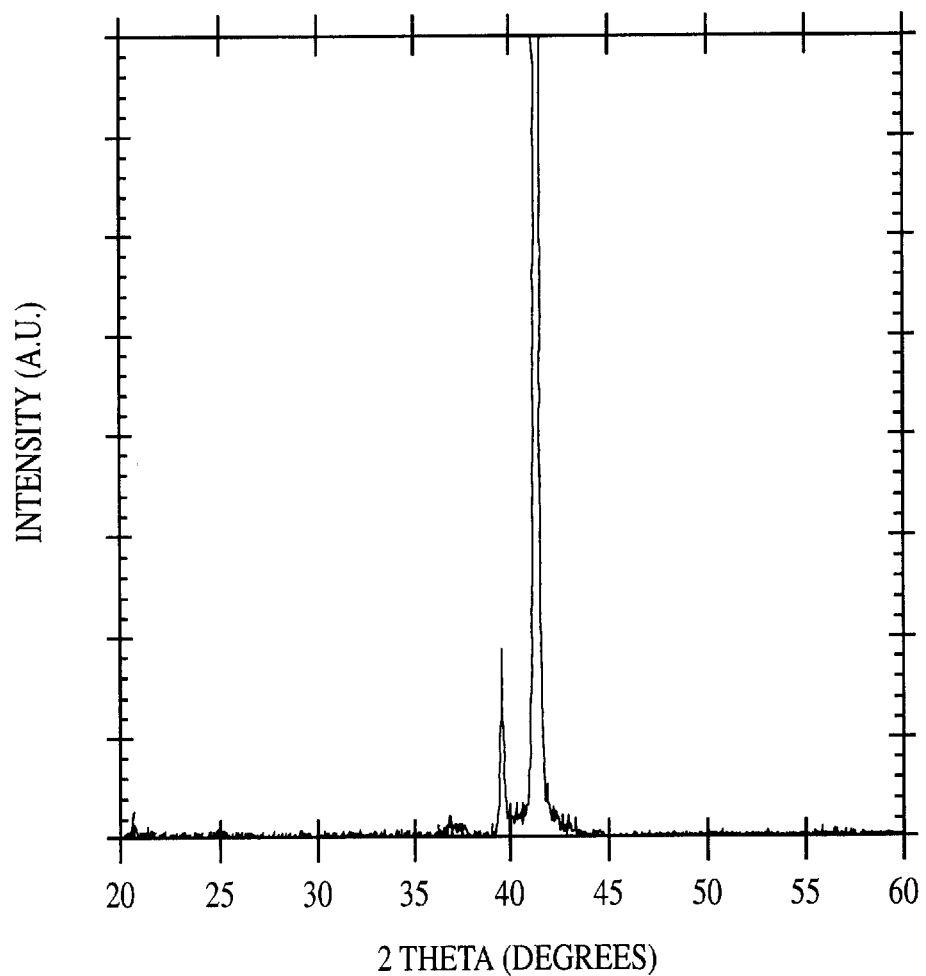
FIG. 1 is a graph of an X-ray diffraction Θ–2Θ scan of the product made according to the present invention.

The present invention combines high-dose ion implantation, thermal processing, and optical characterization techniques to synthesize a new type of optically active surface. The fabrication of this new type of precipitate host-composite "smart" surface is based on the use of ion implantation, and subsequent thermal annealing, to create crystallographically coherent particles of $VO_2$ embedded in a sapphire ($Al_2O_3$) substrate.

In the preferred embodiment, $VO_2$ is used as the embedded phase because of the tremendous property changes in the oxide that occur at a relatively low temperature. At a temperature of about 70° C., the vanadium dioxide phase exhibits a structural phase transformation, with a change in structure from monoclinic to tetragonal that is accompanied by a semi-conducting-to-metallic transition. The optical properties, as a consequence, are strongly affected. This change in the optical and electronic properties is a reversible process, and the characteristics of the transmittance and the reflectance as a function of temperature represent the basis for a variety of applications.

In particular, optically active complex surface structures on single crystals of $Al_2O_3$ are produced by forming $VO_2$ precipitates by the highly non-equilibrium process of ion implantation. An advantage of this type of active-composite surface is that the active components, in the form of precipitates, are an integral part of the near-surface region of the host material, and are, therefore, protected from potential environmental degradation effects.

In the present invention, sapphire substrates are preferably used as the host material, although other optically transparent substrates evident to one skilled in the art can be employed. The initial step in the creation of a $VO_2$-precipitate/$Al_2O_3$ composite surface consists of a room-temperature, high-fluence, stoichiometric co-implantation of vanadium and oxygen into c-axis oriented $\alpha Al_2O_3$. The vanadium implant is carried out at a fluence of about $0.5 \times 10^{17}$ to $2 \times 10^{17}$ ion/cm² preferably at $2 \times 10^{17}$ ion/cm², at energies of about 150 to 300 keV, preferably 300 keV. Oxygen implantation is then performed at energies of about 55 to 120 keV, preferably 120 keV, so that both the vanadium and oxygen implant profiles overlap in the same near-surface region of the sapphire substrate.

Co-implantation with oxygen is carried out with an implant ratio of oxygen to vanadium of about 2:1. The implanted crystals are thermally annealed in a high-purity flowing inert gas such as $N_2$ or argon ($O_2$ partial pressure is approximately 100 ppm) at temperatures ranging from about 500° to 1100° C. for about 10–30 min. In a preferred embodiment the crystals were annealed in argon for 10 min., at 900° C. As a result, vanadium dioxide precipitates are formed in the near-surface region of the $Al_2O_3$ substrate.

The specific identification of the $VO_2$ phase can be confirmed by means of optical measurements which may be made at varying temperatures using a Perkin-Elmer Model 580 double-grating spectrophotometer. The implanted surfaces can also be analyzed using Rutherford backscattering (RBS)/channeling spectroscopy both prior to and after the thermal treatment, in order to follow the epitaxial regrowth of the ion-beam-amorphized near-surface region of the $Al_2O_3$ lattice and to determine the final distribution of vanadium ions.

The x-ray diffraction results for a $\Theta$–$2\Theta$ scan of the recrystallized $Al_2O_3$ co-implanted with vanadium and oxygen and annealed at 900° C. for ten minutes are shown in FIG. 1. The peak at $2\Theta = 41.75°$ represents the (0006) $Al_2O_3$ reflection. The second peak observed at $2\Theta = 39.9°$ is due to an oxide of vanadium, and is characteristic of the $VO_2$ phase. However, the second peak could also correspond to any one of several vanadium oxides. Therefore, the x-ray results alone are not sufficient to establish unequivocally the presence of $VO_2$.

Figure 2:
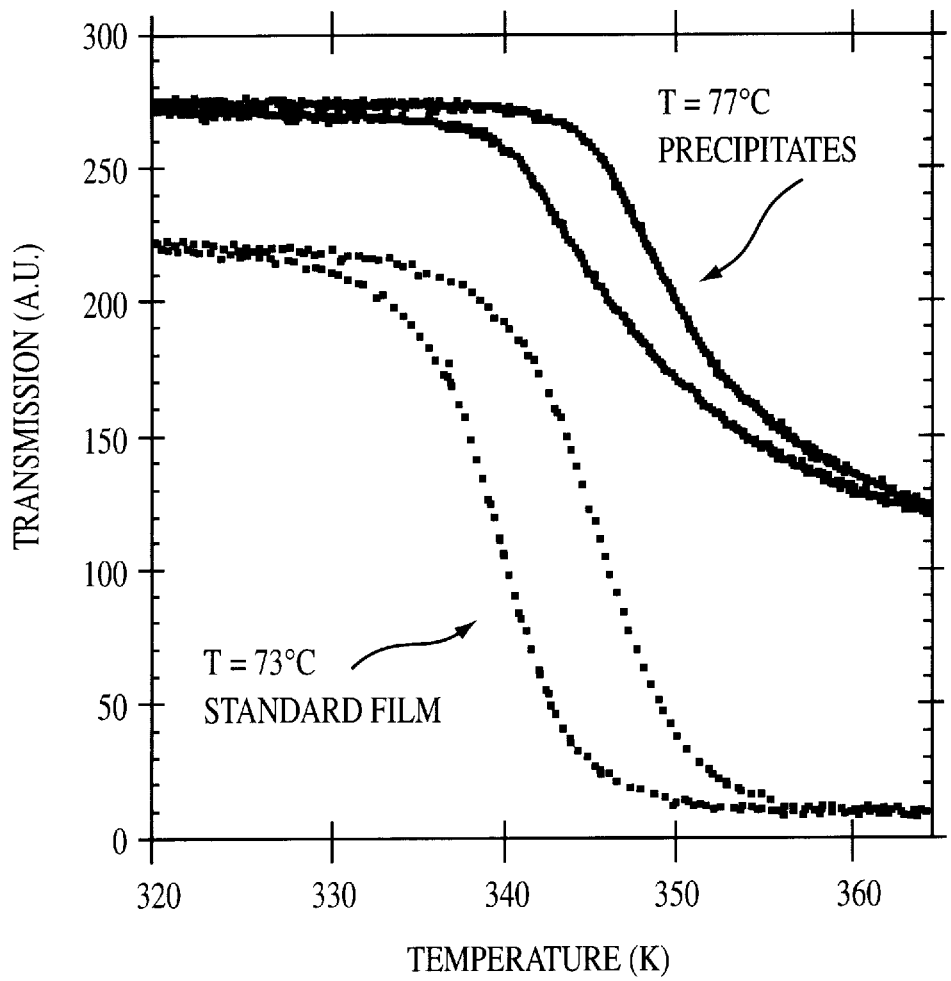
FIG. 2 is a graph of the optical transmission spectrum of a fixed wavelength of the product made according to the present invention as compared to a standard thin film of $VO_2$ deposited on $Al_2O_3$.

An alternative method was used to confirm the presence of the $VO_2$ phase in the sapphire substrate. The formation of the $VO_2$ phase was unequivocally established using optical-transmission measurements. FIG. 2 shows the results of an optical-transmission measurement made at a fixed wavelength of 3.4 μm as the implanted/annealed specimen was scanned at temperatures of between 320 and 365 K. The $VO_2$ is readily discernible through optical-transmission measurements, since the optical properties of $VO_2$ change dramatically at the semi-conducting-to-metal transition temperature. The reversible, but hysteretic, change in optical transmission observed near ~77° C. for the implanted/annealed material may be compared with a standard $VO_2$ thin film deposited on sapphire, shown in the lower trace, which was also obtained using the same heating and cooling cycle. For the implanted/annealed material, the hysteretic curve is shifted to higher transmission values relative to the standard thin-film due to the noncontinuous nature of the optically active precipitate layer. The slight increase in the shift of the transition temperature to ~77° C. (relative to the standard thin-film value) is believed to arise from an additional interaction between the embedded phase and the surrounding host sapphire lattice.

Figure 3:
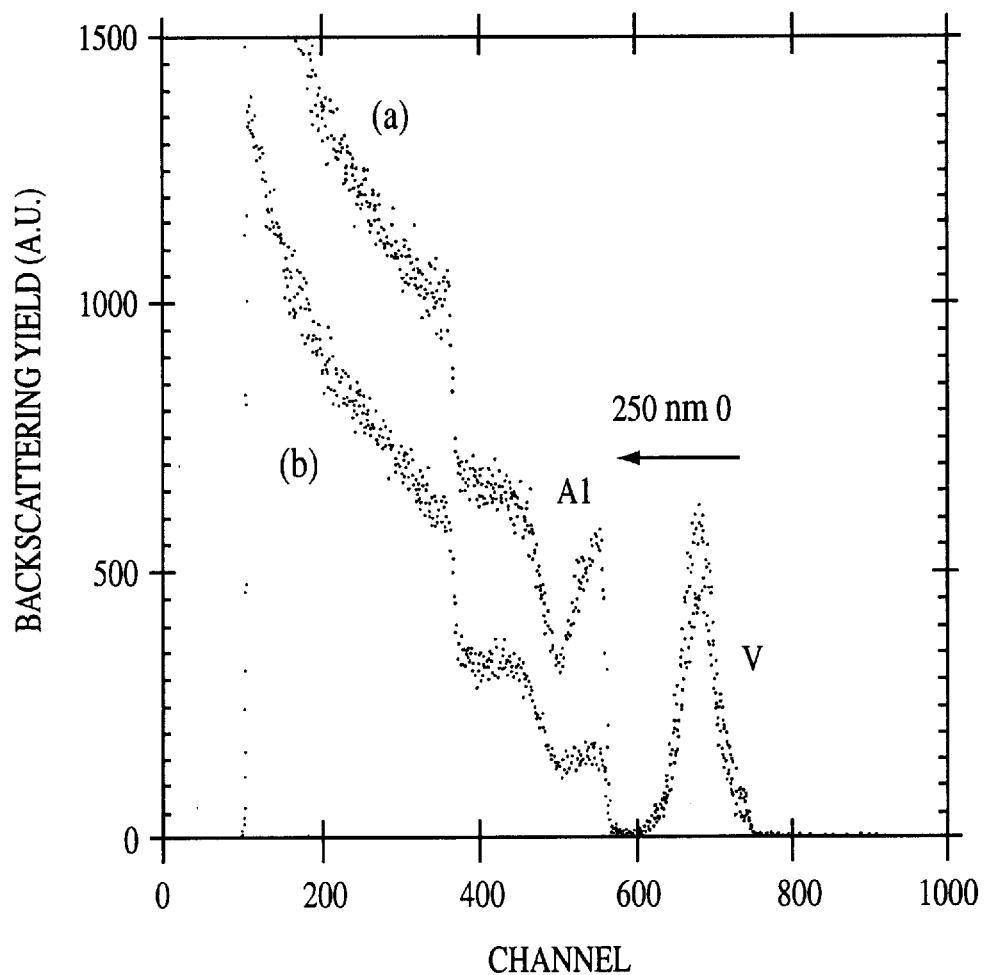
FIG. 3 is a graph of Rutherford backscattering (RBS)/channeling spectra for the product made according to the present invention.
Figure 4:
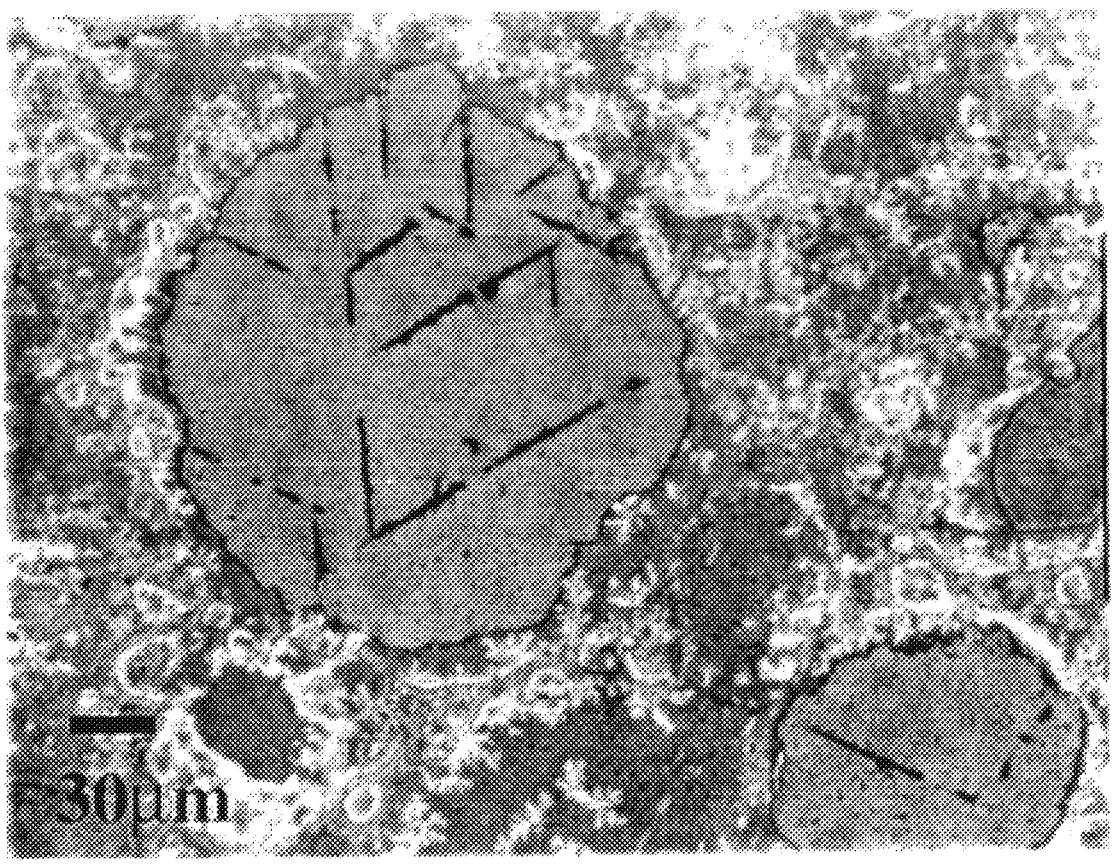
FIG. 4 is an optical micrograph of the $Al_2O_3$ substrate containing the $VO_2$ precipitates.

FIG. 3 shows the RBS/channeling spectra obtained for the implanted and annealed specimen whose optical-transmission spectrum is illustrated in the top trace of FIG. 2. The RBS spectrum was obtained using a rotating-random geometry and is shown in trace (a) of FIG. 3, and the channeling spectrum is illustrated in trace (b). These results show that the vanadium distribution in the sapphire lattice has a maximum depth of ~140 nm. The decrease in the aluminum yield evident in the random spectrum is attributed to the high local concentration of vanadium associated with the implant dose of $2 \times 10^{17}$ ions/cm². The channeling results indicate, first, that significant recrystallization of the ion-beam-amorphized $Al_2O_3$ lattice has occurred during the annealing process, and second, the $VO_2$ precipitates have formed with at least a one-dimensional "fiber-texture-type" alignment so that one channeling direction of $VO_2$ lies perpendicular to the surface of the sapphire host. Finally, an optical micrograph of FIG. 4 illustrates the $Al_2O_3$ substrate with embedded $VO_2$ precipitates. The precipitates are visible in the region where the original surface has spalled off. Thus, the cumulative channeling, optical, x-ray, and optical micrograph results established the full three-dimensional nature, and the coherence between the $VO_2$ precipitates and the $Al_2O_3$ lattice.

Ion implantation and thermal-treatment techniques are an effective method for creating optically active switchable surfaces. In "embedded-composite" systems of this type, the active material (e.g., a $VO_2$ precipitate) is protected from the surrounding environment by the inert host medium, thereby providing an advantage over unprotected thin films. In particular, for optical storage devices, which represent one of the applications of major importance for such a device, the substrate can protect not only against laser-beam radiation damage, but can also act as a heat sink providing the high cooling rate necessary for erasable high-rate optical storage. This implantation and annealing approach can potentially be applied to the formation of numerous other precipitate composite systems, by combining different "active" or "reactive" precipitates with various host lattices such as $LiNbO_3$, $KNbO_3$, $BaTiO_3$, or $PbTiO_3$ to create a variety of new "responsive" surfaces.

Furthermore, excellent adhesion between the active composite "precipitate/host" layer and the surrounding pure host medium enhances the optical properties of the interface. The present invention also teaches that, due to the three-dimensional orientation of the precipitates relative to the host medium, enhanced optical properties can be obtained including a well-defined variation in the optical reflectivity between the "switched" and the "unswitched" states. Optical bits could, in fact, be recorded on one precipitate, thereby avoiding cross talk or strain problems at the interface between a "switched" and an "unswitched" region. Such undesirable effects are exhibited by conventional thin-film systems in which a continuous $VO_2$ film is simply deposited on a substrate surface.

Other applications for such a system include embedded temperature sensors; for example, the temperature of transparent windows could be monitored by the change in transmission through the windows. Similarly, the transmittance or reflectance of a self-supported active window could be regulated with respect to a change in temperature. Changes in temperature resulting in optical switching can also be produced by intense laser light.

In an alternative embodiment, in-situ doping of the $VO_2$ phase may be performed in order to lower the temperature at which the semiconductor-to-metal phase transformation takes place. This is accomplished by implanting an impurity to lower the transition temperature before the $VO_2$-implanted sample is annealed. Examples of such impurities are tungsten (W) and Niobium (Nb). Very little dopant is needed for producing a shift in the transition temperature, therefore, no extra phase formation should occur.

In addition, the formation of other vanadium oxide precipitates in sapphire with a different crystallographic orientation can provide a surface-composite material with a different in-plane alignment and dispersion of the precipitates. For example, the formation of $V_2O_3$ imbedded precipitates is attained by annealing the implanted sapphire host in a reducing atmosphere. The $V_2O_3$ precipitates undergo a phase transition but at a different transition temperature (e.g. at ~155° K.). Thus, a different phase of vanadium oxide can be used to obtain an active surface whose response occurs in a significantly different temperature range.

Figure 5:
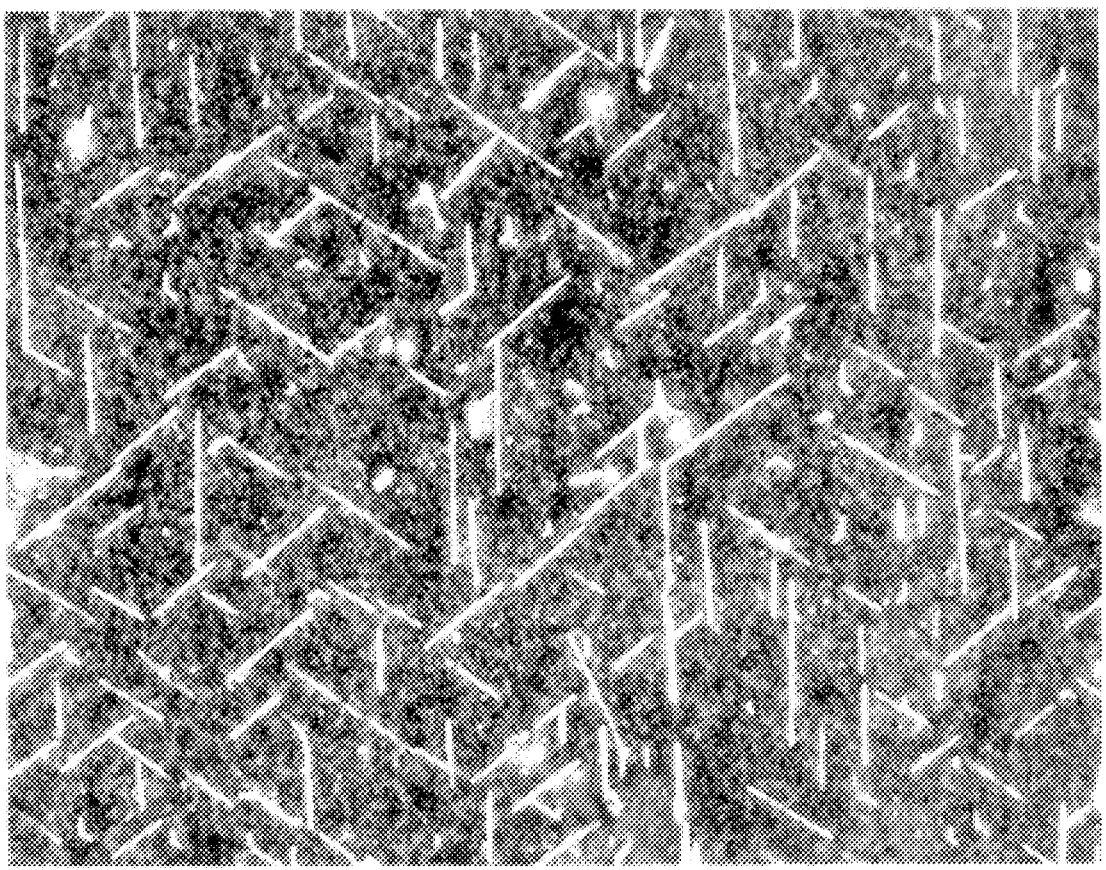
FIG. 5 is an optical micrograph of the product made according to the present invention where the crystallographically oriented $VO_2$ precipitates reach the surface due to the choice of a lower implantation energy than used for FIG. 4.

Other applications include the fabrication of new electronic systems. By varying the implantation energy, it is possible to form crystallographically oriented vanadium oxide precipitates that reach the surface of the substrate, as illustrated with reference to FIG. 5. The shape of the precipitates is essentially one-dimensional with an average length-over-width ratio greater than 20. Such surface $VO_2$ precipitates may be used as wires embedded in an isolating matrix, for which electrical contacts can easily be made at the free surface of the $VO_2$ phase. Reduction of the dimensions of the wire-like features through the careful monitoring of the processing conditions could allow for the formation of nanowires. Furthermore, the wire-like shape of the precipitates allows the possibility of the controllable transmission of current (ON=T>Tc and OFF=T<Tc)– at a reduced scale at the surface of an insulating substrate.

The present invention and basic method for the formation of an active optical surface on the surface of the substrate may be applied to substrates such as $Al_2O_3$, $LiNbO_3$, $KNbO_3$, $ZnO$, $TeO_2$, $SiO_2$ glasses, $MgO$, $PbTiO_3$, or $BaTiO_3$ through the combined steps of ion implantation and thermal processing. This combination of techniques is used to form embedded precipitated phases in the near-surface region of a host material. This approach to forming active surface composites is applicable to a wide range of combinations of precipitate phases which undergo phase transitions and to a wide range of host materials including both crystalline and amorphous forms of matter. Accordingly, this basic approach is applicable to the formation of the general class of new optical materials for applications in numerous devices.

While, this invention been described as having a preferred embodiment, it is understood that it is capable of further modifications, uses, and/or adaptations of the invention and including such departures from the present disclosure as come within known or customary practice in the art to which the invention pertains, as may be applied to the central features herein before set forth, and fall within the scope of the invention and the limits of the appended claims.

We claim:

1. A method of forming an optically active device comprising crystallographically coherent precipitates of vanadium dioxide embedded in a near-surface region of a substrate, said device having an optical property of a defined variation in optical reflectivity or transmission between "switched" and "unswitched" states, comprising steps of:
   a. providing the substrate as a host material;
   b. implanting ions of vanadium into the substrate;
   c. co-implanting a stoichiometrically sufficient amount of ions of oxygen into the substrate to subsequently form said precipitates; and
   d. annealing the substrate in an inert atmosphere to form the vanadium dioxide coherent precipitates in the near-surface region of the substrate;
   wherein a self-protected optical surface of said device is obtained.

2. The method of claim 1, further including:
   a. performing said step of annealing the substrate so that the vanadium dioxide is three-dimensionally oriented with respect to crystal axes of the host material.

3. The method of claim 1, further including:
   a. performing said step of annealing the substrate at temperatures of about 500° to 1100° C.

4. The method of claim 3, further including:
   a. performing said step of annealing said substrate in flowing argon gas.

5. The method of claim 1, further including:
   a. providing $Al_2O_3$ as the host material.

6. The method of claim 1, further including:
   a. providing the host material selected from the group consisting of $LiNbO_3$, $KNbO_3$, $ZnO$, $TeO_2$, $MgO$, $PbTiO_3$, and $BaTiO_3$.

7. The method of claim 1, further including:
   a. performing said step of implanting the ions of vanadium at room temperature at a fluence of about $0.5 \times 10^{17}$ to $2 \times 10^{17}$ ions/cm$^2$ and energies of about 150 to 300 keV.

8. The method of claim 7, further including:
   a. performing said step of co-implanting the ions of oxygen at energies of about 55 to 120 keV wherein oxygen is at a partial pressure of about 100 ppm.

9. The method of claim 1, further including:
   a. performing said step of annealing the substrate for about 10–30 minutes.

10. The method of claim 1, wherein;
    a) said step of co-implanting a stoichiometrically sufficient amount of the ions of oxygen is carried out with an oxygen-to-vanadium implant ratio of 2:1.

11. The method of claim 1, further including:
    a) varying implant energy to a degree sufficient so that some vanadium dioxide precipitates reach a surface of the substrate wherein the precipitates have the appearance of wires, with an average length-over-width ratio of greater than 20.

12. A method of forming crystallographically coherent precipitates of vanadium dioxide in a near-surface region of a substrate in order to lower a phase transition temperature of a precipitate-substrate, comprising steps of:
   a. providing the substrate as a host material;
   b. implanting ions of vanadium into the substrate;
   c. co-implanting stoichiometrically sufficient amount of ions of oxygen into the substrate in an oxygen-to-vanadium ratio of 2.1;
   d. implanting an impurity into the substrate wherein the phase transition temperature is lowered; and
   e. annealing the substrate to form the vanadium dioxide precipitates in the near-surface region of the substrate.

13. The method of claim 12, further including:
   a. performing said step of annealing the substrate so that the vanadium dioxide is three dimensionally oriented with respect to crystal axes of the host material.

14. The method of claim 12, further including:
   a. performing said step of annealing the substrate at temperatures of between about 500° to 1100° C.

15. The method of claim 14, further including:
   a. performing said step of annealing said substrate in flowing argon gas.

16. The method of claim 12, further including:
   a. providing $Al_2O_3$ as the host material.

17. The method of claim 12, further including:
   a. providing as the host material a material selected from the group consisting of $LiNbO_3$, $KNbO_3$, ZnO, $TeO_2$, MgO, $PbTiO_3$, and $BaTiO_3$.

18. The method of claim 12, further including:
   a. performing said step of implanting the ions of vanadium at room temperature at fluences of about $0.5 \times 10^{17}$ to $2 \times 10^{17}$ ions/cm$^2$ and energies of about 150 to 300 keV.

19. The method of claim 18, further including:
   a. performing said step of co-implanting the ions of oxygen at energies of about 55 to 120 keV wherein the oxygen is at a partial pressure of about 100 ppm.

20. The method of claim 12, further including
   a. performing said step of annealing the substrate for about 10–30 minutes.

21. The method of claim 12, further including:
   a. providing as the impurity a material selected from the group consisting of niobium and tungsten.

22. A method of forming an optically active device comprising crystallographically coherent precipitates of vanadium dioxide embedded in a near-surface region of a substrate, said device having an optical property of a defined variation in optical reflectivity or transmission between "switched" and "unswitched" states, comprising steps of:
   a. providing the substrate as a host material;
   b. implanting ions of vanadium into the substrate at a maximum depth of about 40 nm;
   c. co-implanting a stoichiometrically sufficient amount of ions of oxygen into the substrate to subsequently form said precipitates; and
   d. annealing the substrate in an inert atmosphere to form the vanadium dioxide coherent precipitates in the near-surface region of the substrate; wherein a self-protected optical surface of said device is obtained.

* * * * *